(12) United States Patent (10) Patent No.: US 6,838,730 B1
Kawaguchi et al. (45) Date of Patent: Jan. 4, 2005

(54) SEMICONDUCTOR DEVICE

(75) Inventors: Yusuke Kawaguchi, Kanagawa (JP);
Syotaro Ono, Kanagawa (JP);
Yoshihiro Yamaguchi, Saitama (JP);
Akio Nakagawa, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/781,688

(22) Filed: Feb. 20, 2004

(30) Foreign Application Priority Data

Jun. 18, 2003 (JP) ........................................ 2003-173852

(51) Int. Cl.$^7$ ........................ H01L 29/76; H01L 29/94; H01L 31/062; H01L 31/113; H01L 31/119
(52) U.S. Cl. ...................... 257/331; 257/329; 257/330; 257/332; 257/334
(58) Field of Search ............................... 257/329, 330, 257/331, 332, 334

(56) References Cited

U.S. PATENT DOCUMENTS 6,545,315 B2 * 4/2003 Hshieh et al. ............... 257/328
2002/0038887 A1 * 4/2002 Ninomiya et al. .......... 257/336

FOREIGN PATENT DOCUMENTS

JP 2000-299464 10/2000

* cited by examiner

Primary Examiner—Ngân V. Ngô
(74) Attorney, Agent, or Firm—Oblon, Spivak, McClelland, Maier & Neustadt, P.C.

(57) ABSTRACT

A semiconductor device comprises a first semiconductor layer of a first conductivity type, a second semiconductor layer of the first conductivity type formed in an upper surface of the first semiconductor layer, resistance of the second semiconductor layer being higher than that of the first semiconductor layer, a base layer of a second conductivity type formed on the second semiconductor layer, gate electrodes deposited in a plurality of first trenches, a gate insulation film being disposed between inner walls and the gate electrodes, each of the first trenches having a band-shaped planar pattern and extending from top of the base layer down to the upper surface of the second semiconductor layer, bridge electrodes filling a plurality of second trenches and surrounded by an insulation film deposited over walls of the trenches, the second trenches extending from the top of the base layer down to the upper surface of the second semiconductor layer and connecting adjacent ones of the first trenches in communication with one another so that each of the bridge electrodes electrically connects adjacent ones of the gate electrodes, an impurity diffused region of the second conductivity type formed in the second semiconductor layer adapted to surround the second trenches existing in the second semiconductor layer, a source region of the first conductivity type formed in a surface area of the base layer alongside extensions of the gate electrodes, a source electrode formed on the surface of the source region, and a drain electrode formed on a back surface of the first semiconductor layer.

10 Claims, 5 Drawing Sheets

US 6,838,730 B1

SEMICONDUCTOR DEVICE

CROSS REFERENCE TO RELATED APPLICATION

This application is based upon and claims the benefit of priority from the prior Japanese Patent Application No. 2003-173852, filed on Jun. 18, 2003; the entire contents of which are incorporated herein by reference.

BACKGROUND OF THE INVENTION

The present invention relates to a semiconductor device, and more particularly, to a power metal oxide semiconductor (MOS) transistor.

Recently, there has been an increased rush for power metal oxide semiconductor field effect transistors (MOSFETs) in the markets of switching power supplies for good characteristics of high-current power and high withstand voltage as well as in the market of energy saving switching power supplies for mobile electronic equipment such as a notebook PC. The power MOSFETs dedicated to the mobile electronic equipment are typically used for a power management circuit, an overcharge protection circuit of a lithium cell, and the like.

Among such power MOSFETs, some used in the mobile electronic equipment is strongly desired to have a reduced switching loss as well as enhanced performance of operability at lower supply voltage, which enables a directly operation by a battery. In order to reduce the switching loss, for instance, a resistance upon turning the transistor on (referred to as ON-resistance), a gate-drain capacitance, and a gate resistance must be reduced.

Various indices are used to represent characteristics of the power MOSFET, including a product of the ON-resistance ($R_{on}$) multiplied by the electronic charges ($Q_{gd}$) charged in a gate-drain capacitor, namely, the gate-drain capacitance, $R_{on} \times Q_{gd}$, and the gate resistance representing a resistance across the gate electrode. Requirements to reduce the switching loss will be lowering both of the indices, $R_{on} \times Q_{gd}$ and the gate resistance.

However, lowering the gate resistance in order to reduce the switching loss leads to an adverse effect of an increase in the product $R_{on} \times Q_{gd}$. On the other hand, a reduction of $R_{on} \times Q_{gd}$ causes an undesirable increase in the gate resistance. Hence, it's not a simple matter to find a solution of the reduction of the switching loss. This will be detailed below.

FIG. 7 is a cross-sectional perspective view showing a prior art trench-gate power MOSFET. A reference alphanumeric number X designates a device pitch.

On an upper principal surface of an $n^+$ type substrate 21, an $n^-$ type epitaxial layer 22 is formed, and then, a p type base layer 23 is further formed on top of the $n^-$ type epitaxial layer 22. A trench 24 is dug, extending from an upper surface of the p type base layer 23 down to the underlying $n^-$ type epitaxial layer 22. A gate insulation film 25 is deposited to cover side and bottom walls of the trench 24, and then, a gate electrode 26 is deposited inside the gate insulation film 25 to fill the trench 24. On an exposed surface of the gate electrode 26, an interlayer insulation film 28 is disposed. Part of a surface area of the p type base layer 23 alongside the trench 24 is covered with an $n^+$ type source region 29, and the remaining surface area of the p type base layer 23 is coated with the $p^+$ type diffusion region 30. The $p^+$ type diffusion region 30, the $n^+$ type source region 29, and the interlayer insulation film 28 are overlaid with a source electrode (not shown), and on a lower principal surface of the $n^+$ type substrate 21, a drain electrode (not shown) is formed.

In FIG. 7, the above-mentioned ON-resistance $R_{on}$ is a resistance between the $n^+$ type source region 29 and the $n^+$ type substrate 21. The capacitance $Q_{gd}$ is an electric charge accumulated in a capacitor consisting of the gate electrode 26 and the $n^-$ type epitaxial layer 22. A gate resistance is a resistance occurring across the gate electrode 26.

FIG. 8 is a graph schematically illustrating characteristics of drain voltage (ON voltage) and drain current upon turning the power MOSFET in FIG. 7.

In FIG. 8, $V_{ds}$ denotes a drain voltage (voltage between a drain and a source) while Id denotes the drain current.

As can be seen in FIG. 8, at time zero, voltage is applied between the source electrode (not shown) and the gate electrode 26 to turn the gate electrode to positive while voltage is being applied between the drain electrode (not shown) and the source electrode (not shown) to turn the drain electrode to positive. During a delay time before time t1, the drain current Id scarcely flows, but after time t1, the drain current gradually increases till time t2 when the drain current Id reaches a predetermined level. In this state, the device turns on. The above-mentioned ON-resistance $R_{on}$ is the drain voltage $V_{ds}$ ($V_r$) at this time divided by the concurrent drain current Id.

As in FIG. 8, a time interval ($T_{gd}$) from time t1 to time t2 is identical with a period of time when the gate-drain capacitor is being charged. The switching loss can be expressed by a product of the drain current Id and the drain voltage $V_{ds}$ during the charge period $T_{gd}$ (an amount of Id from time 0 to time t1 is minimal, and the switching loss during the period is negligible). Thus, the shorter charge period $T_{gd}$ brings about the accordingly reduced switching loss.

One way of shortening the charge time Tgd is reducing the gate resistance. This is because a reduction of the gate resistance permits electric charge to be rapidly accumulated in the gate-drain capacitor. To attain this, specifically as shown in FIG. 7, the trench 24 may be dimensioned to have a greater depth, thereby increasing a cross sectional area of the gate electrode 26.

This way of reducing the gate resistance results in an increase in an area of the interface between the gate electrode 26 and the $n^-$ type epitaxial layer 22 to cause the gate-drain capacitance $Q_{gd}$ to increase, which consequently leads to an increase of $R_{on} \times Q_{gd}$.

SUMMARY OF THE INVENTION

According to a first aspect of the present invention, there is provided a semiconductor device comprising:

a first semiconductor layer of a first conductivity type, a second semiconductor layer of the first conductivity type formed in an upper surface of the first semiconductor layer, resistance of the second semiconductor layer being higher than that of the first semiconductor layer, a base layer of a second conductivity type formed on the second semiconductor layer, gate electrodes deposited in a plurality of first trenches, a gate insulation film being disposed between inner walls and the gate electrodes, each of the first trenches having a band-shaped planar pattern and extending from top of the base layer down to the upper surface of the second semiconductor layer, bridge electrodes filling a plurality of second trenches and surrounded by an insulation film deposited over walls of the trenches, the second trenches extending from the top of the base layer down to the upper surface of the second semiconductor layer and connecting adjacent ones of the first trenches in communication with one another so that each of the bridge electrodes electrically connects adjacent ones of the gate electrodes, an impurity diffused region of the second conductivity type formed in the second semiconductor layer adapted to surround the second trenches existing in the second semiconductor layer, a source region of the first conductivity type formed in a surface area of the base layer alongside extensions of the gate electrodes, a source electrode formed on the surface of the source region; and a drain electrode formed on a back surface of the first semiconductor layer.

According to a second aspect of the present invention, there is provided a semiconductor device comprising:

a first semiconductor layer of a first conductivity type, a second semiconductor layer of the first conductivity type formed on an upper surface of the first semiconductor layer, resistance of the second semiconductor layer being higher than that of the first semiconductor layer, a base layer of a second conductivity type formed on the second semiconductor layer, gate electrodes deposited in a plurality of first trenches, a gate insulation film being disposed between inner walls and the gate electrodes, each of the first trenches having a band-shaped planar pattern and extending from top of the base layer down to the upper surface of the second semiconductor layer, bridge electrodes filling a plurality of second trenches and surrounded by an insulation film deposited over walls of the trenches, the second trenches extending from the top of the base layer and being smaller in depth than the base layer, each of the second trenches connecting adjacent ones of the first trenches in communication with one another so that each of the bridge electrodes electrically connects adjacent ones of the gate electrodes, a source region of the first conductivity type formed in a surface area of the base layer alongside extensions of the gate electrodes, a source electrode formed on the source region, an impurity diffused region of the first conductivity type formed around lower portions of the first trenches in the base layer and being contiguous to the second semiconductor layer so as to provide a channel conducting to the source region, and a drain electrode provided on a back surface of the first semiconductor layer.

According to a third aspect of the present invention, there is provided a semiconductor device, comprising:

a first semiconductor layer of a first conductivity type, a second semiconductor layer of the first conductivity type formed in an upper principal surface of the first semiconductor layer, the second semiconductor layer being higher in resistance than the first semiconductor layer, a base layer of a second conductivity type formed in an upper principal surface of the second semiconductor layer, gate electrodes deposited in a plurality of first trenches, a gate insulation film being disposed between inner walls and the gate electrodes, each of the first trenches having a band-shaped planar pattern and extending from top of the base layer down to the upper surface of the second semiconductor layer, bridge electrodes filling a plurality of second trenches and surrounded by an insulation film deposited over walls of the trenches, the second trenches extending from the top of the base layer and being smaller in depth than the base layer, each of the second trenches connecting adjacent ones of the first trenches in communication with one another so that each of the bridge electrodes electrically connects adjacent ones of the gate electrodes, a source region of the first conductivity type formed on a surface area of the base layer alongside extensions of the gate electrodes, a source electrode formed on the source region, and a drain electrode provided on a back surface of the first semiconductor layer.

BRIEF DESCRIPTION OF THE DRAWINGS

FIG. 8 is a graph illustrating a switching loss in the prior art power MOSFET upon turning the transistor on.

DETAILED DESCRIPTION OF THE INVENTION (Embodiment 1)

Figure 1A:
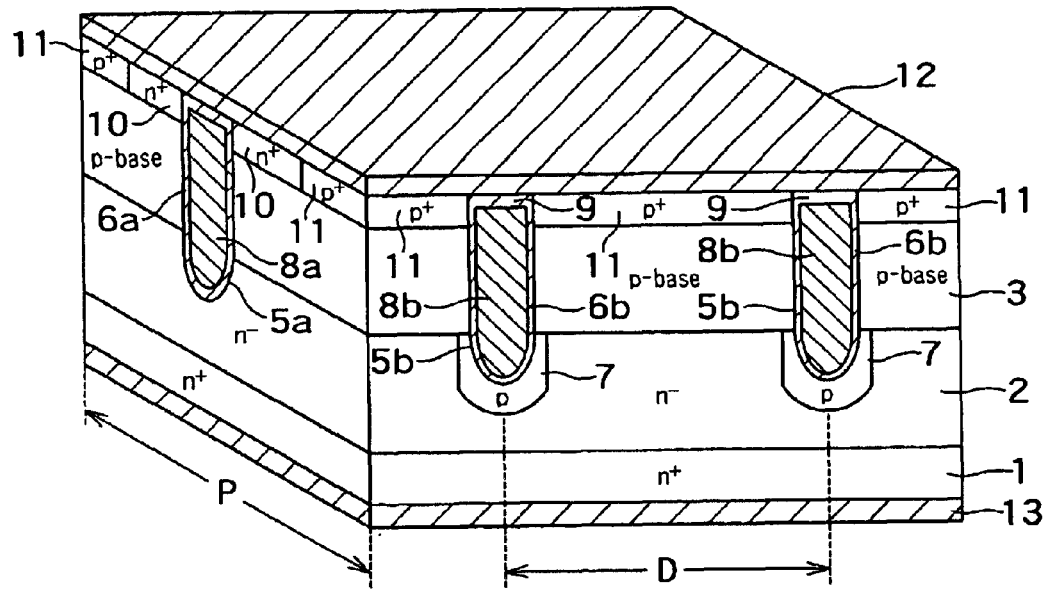
FIG. 1A and FIG. 1B are partial cross-sectional perspective views showing a first embodiment of a power MOSFET according to the present invention.
Figure 1B:
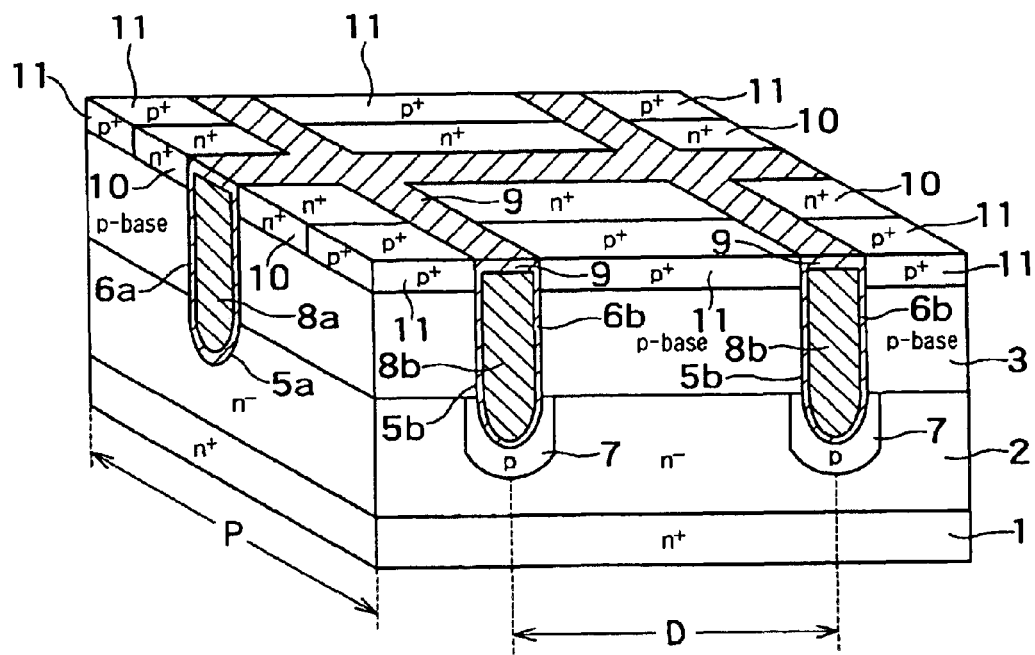

FIG. 1A is a partial cross-sectional perspective view showing a first embodiment of a power MOSFET according to the present invention. FIG. 1B is a cross-sectional perspective view of the power MOSFET having a source electrode 12 and a drain electrode 13 eliminated from the structure in FIG. 1.

In FIGS. 1A and 1B, a reference letter P denotes a device pitch. The device pitch P is 4 μm, for example, and a length of the device in a direction along the pitch P is 2 mm, for example.

As depicted in FIG. 1B, an $n^+$ type substrate 1 is superposed with an $n^-$ type epitaxial layer 2 which has its upper principal surface further overlaid with a p type base layer 3. Trenches 5a and 5b are dug, extending from top of the p type base layer 3 down to the upper surface of the underlying $n^-$ type epitaxial layer 2.

There are a plurality of the elongated trenches 5a, which are separated from each other at an identical interval along an extension of the pitch P and are all perpendicular to the extension of the pitch P but in parallel with the principal surface of the substrate. There are also more than one of the trenches 5b separated from each other at an interval of D in communication with the trenches 5a. The trenches 5a and 5b are of the same depth and may be made either in the same process step or in separate process steps.

The elongated trenches 5a have their respective side and bottom walls covered with a gate insulation film 6a of silicon oxide, for example. Over the gate insulation film 6a, doped polysilicon, for example, is deposited to fill the trenches and have gate electrodes 8a embedded therein.

On the other hand, the trenches 5b have their respective side and bottom walls covered with an insulation film 6b of silicon oxide, for example. Over the insulation film 6b, similarly doped polysilicon, for example, is deposited to have bridge electrodes 8b embedded therein, and each connects a pair of the adjacent gate electrodes and reduces a gate resistance thereacross.

The gate electrodes 8a and the bridge electrodes 8b may be made either in the same process step or in separate process steps.

As can be seen in FIG. 1B, as the bridge electrodes 8b are deployed at smaller pitches, the gate resistance across the same is reduced. With the bridge electrodes 8a deployed at the excessively small pitches, however, channel regions formed in the vicinity of the side walls of the elongated trenches 6a are undesirably small. This means an undesired reduction of a drain current. Thus, the pitch of the bridge electrode 8b, namely, the distance D between the trenches 5b is determined, allowing for optimization of the gate resistance and the drain current in combination.

A p type diffusion region 7 is formed to surround a lower portion of each of the trenches 5b that reach the n⁻ type epitaxial layer 2. The p type diffusion region 7 prevents the bridge electrode 8b and the n⁻ type epitaxial layer 2 from close juxtaposition. In this way, the p type diffusion region 7 can avoid development of a capacitor (gate-drain capacitor) between the bridge electrode 8b and the n⁻ epitaxial layer 2 upon turning the power MOSFET on. Preferably, as depicted in FIG. 1B, the P diffusion region 7 is not formed in any area under an n⁺ type source region 10 where a channel region is to be formed.

An interlayer insulation film 9 is deposited over exposed surfaces of the gate electrodes 8a and the bridge electrodes 8b.

The n⁺ type source region 10 is formed in the both sides of the trenches 5a alongside the same in part of an upper surface of the P base layer 3. In the remaining areas of the upper surface of the p type base layer 3, a p⁺ type diffusion region 11 is formed. The p⁺ type diffusion region 11 serves to reduce a resistance developed upon movement of holes generated at a breakdown toward a source electrode 12 (mentioned later).

On the p⁺ type diffusion region 11, the n⁺ type source region 10, and the interlayer insulation film 9, as shown in FIG. 1A, the source electrode 12 of highly conductive material such as aluminum is formed. Similarly, on a lower principal surface of the n⁺ type substrate 1, a drain electrode 13 is formed of highly conductive material such as aluminum.

Configured in this manner, the bridge electrodes 8b each positioned between the pair of the adjacent gate electrodes 8a are capable of reduce the gate resistance across the same, as mentioned above. The p type diffusion region 7 surrounding the lower portion of each of the trenches 5b prevents the development of the capacitor, and then, avoids an increase in capacitance. Further, as apparent from FIG. 1A, the formation of the bridge electrodes 8b causes no increase in the ON-resistance $R_{on}$.

Thus, retaining the product of the ON-resistance multiplied by the gate-drain capacitance ($R_{on} \times Q_{gd}$) small as desired, the gate resistance can be reduced.

Figure 2:
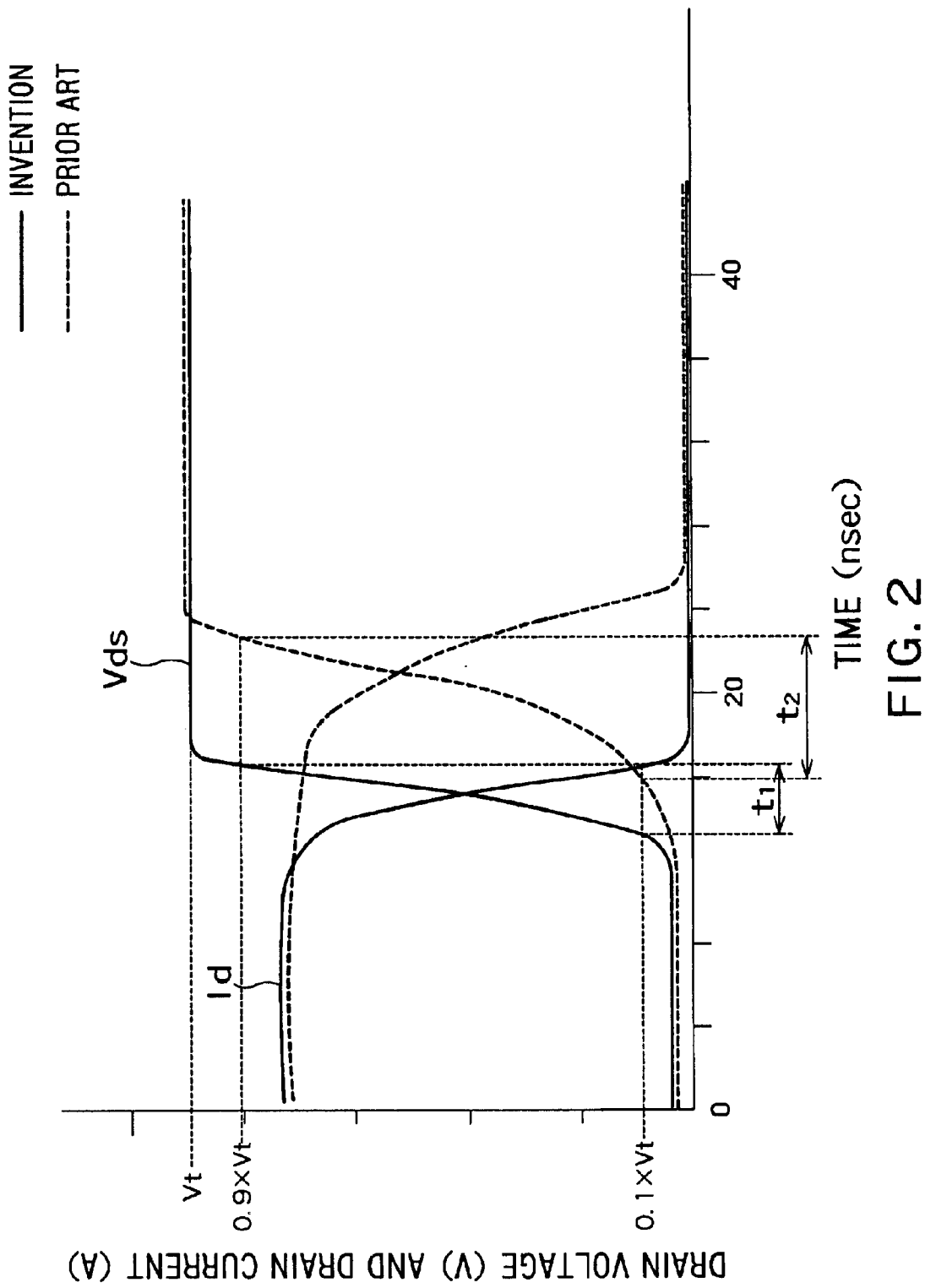
FIG. 2 is a graph showing effects of the first embodiment in comparison with the prior art.

FIG. 2 is a graph showing a switching time upon turning off the power MOSFET in FIG. 1 in comparison with the prior art power MOSFET. The term "switching time" herein is a period of time spent to vary drain voltage $V_{ds}$ from 0.1 $V_t$ to 0.9 $V_t$.

As illustrated in FIG. 2, the power MOSFET in this embodiment needs approximately 4 nsec in switching (time t1). In contrast, the switching time of the prior art MOSFET is about 8 nsec (time t2). Thus, the power MOSFET in this embodiment switches in approx. 4-nsec (t2−t1) which is quicker than the prior art. This is resulted from a reduction of a period of time spent for electric discharge.

More specifically, as in FIG. 2, the time t1 is a period of time needed to electrically discharge while the time 2 is the period of electric discharge in the prior art. A difference between the periods of electrical discharge (t2−t1) is reflected to the aforementioned difference in the switching time.

A reduction of the switching time brings about a reduction of a switching loss. Details of this will be set forth below.

The switching loss during turning the transistor off is expressed by a product of $I_d$ and $V_{ds}$ during the electric discharge, and as the product is reduced, the switching loss becomes accordingly smaller. As mentioned above, it has been proved that this embodiment attains a decrease in the duration of the electric discharge by t2−t1, compared with the prior art embodiment, and this embodiment successfully provides the reduced switching loss.

As has been described, in this embodiment of the present invention, each of the bridge electrodes connects the pair of the adjacent gate electrodes while having its lower portion surrounded by the region diffused with impurities, and therefore, a gate resistance across that portion can be reduced, with the product Ron×Qgd being retained small. Thus, both the duration of discharging energy upon turning the transistor off and the duration of charging energy upon turning it on are reduced, and accordingly, the switching loss can be decreased.

(Embodiment 2)

Figure 3:
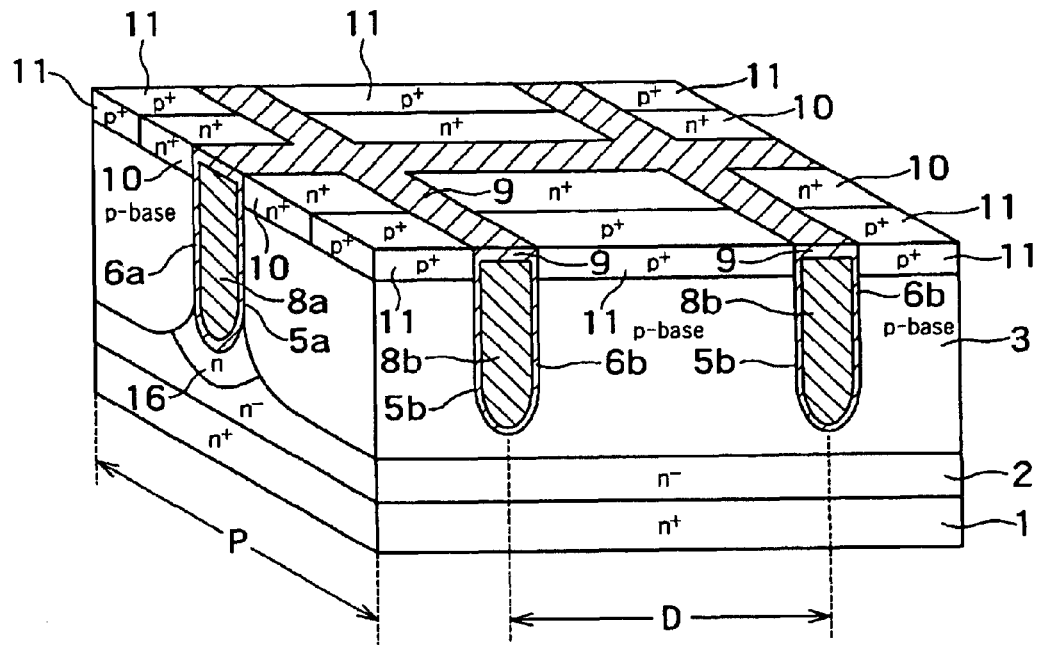
FIG. 3 is a partial cross-sectional perspective view showing a second embodiment of the power MOSFET according to the present invention.

FIG. 3 is a partial cross-sectional perspective view showing a second embodiment of the power MOSFET according to the present invention. In FIG. 3, like reference numerals denote the similar components to those in the first embodiment in FIG. 1.

In this embodiment, unlike the above mentioned first embodiment, neither of the elongated trenches 5a and 5b extending from the upper surface of the p type base layer 3 reaches the n⁻ type epitaxial layer 2, and an n type diffusion region 16 is formed around a lower portion of each of the elongated trenches 5a. This embodiment will be described in more detail below.

As recognized in FIG. 3, similar to the first embodiment, the n⁺ type substrate 1 is overlaid with the n⁻ type epitaxial layer 2 which is further superposed with the p type base layer 3. The p type base layer 3 is greater in depth, compared with the first embodiment.

The trenches 5a and 5b, extending downward from the top surface of the p type base layer 3, are formed smaller in depth than the p type base layer 3. Thus, neither of the trenches 5a and 5b reaches an upper surface of the n⁻ type epitaxial layer 2.

Each of the trenches 5a among the elongated trenches has its lower portion surrounded by the n type diffusion region 16 contiguous to the n⁻ type epitaxial layer 2. The n type diffusion region 16 serves to provide a channel conducting to a source region 10 (mentioned later) upon turning the transistor on.

Inside the walls of the trenches 5a and 5b, similar to the first embodiment, a gate insulation film 6a and an insulation film 6b are deposited to fill the trenches 5a and 5b and have gate electrodes 8a and bridge electrodes 8b embedded therein. Upper surfaces of the gate electrodes 8a and the bridge electrodes 8b are covered with an interlayer insulation film 9. On the upper surface of the p type base layer 3, an n⁺ type source region 10 and a p⁺ type diffusion region 11 are formed.

A source electrode (not shown) is overlaid on the n⁺ type source region 10, the p⁺ type diffusion region 11, and the interlayer insulation film 9, while a drain electrode (not shown) is overlaid on the lower surface of the n⁺ type substrate 1.

As has been described, in this embodiment of the present invention, the trenches 5b are formed so as not to reach the upper surface of the n⁻ type epitaxial layer 2, and hence, the bridge electrodes 8b embedded in the trenches 5b would not overlap the n⁻ type epitaxial layer 2, which effectively prevents development of capacitors between the bridge electrodes 8b and the n⁻ type epitaxial layer 2. Resultantly, a gate resistance across that portion can be decreased with the product $R_{on} \times Q_{gd}$ retained small.

(Embodiment 3)

Figure 4:
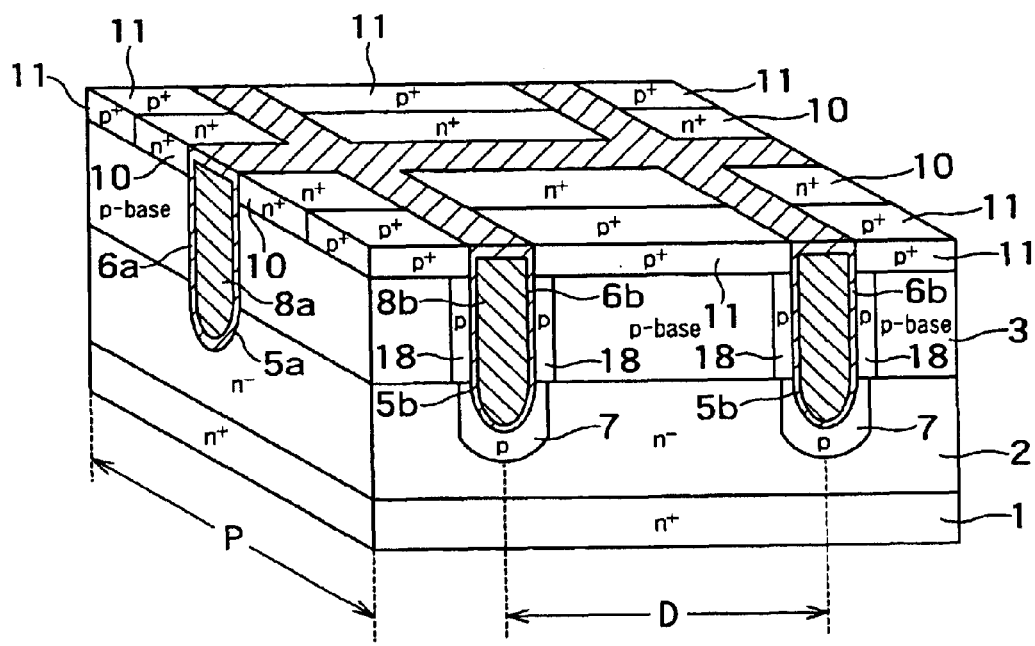
FIG. 4 is a partial cross-sectional perspective view showing a third embodiment of the power MOSFET according to the present invention.

FIG. 4 is a partial cross-sectional perspective view showing a third embodiment of the power MOSFET according to the present invention. In FIG. 4, like reference numerals denote the similar components to those in the first embodiment in FIG. 1.

This embodiment is different from the above-mentioned first embodiment in that a p type diffusion region (prevention region for generation of inverted region; anti-inverting region, hereinafter) 18 is formed in the p type base layer 3 along side walls of the trenches 5b.

In the first embodiment, as depicted in FIG. 1B, upon turning the transistor on, energy is slightly charged in the capacitors between the side walls of the bridge electrodes 8b and the p type base layer 3. Such accumulation of electric charge leads to an increase in gate-drain capacitance $Q_{gd}$.

Thus, in this embodiment, the anti-inverting region 18 is formed on one side of the insulation film 6b opposite to the bridge electrode 8b. The anti-inverting region 18 serves to reduce carriers induced in the contiguous region beyond the insulation film 6b upon turning the transistor on; that is, the anti-inverting region 18 functions to reduce energy charged in the capacitors (i.e., capacitance) between the bridge electrodes 8b and the p type base layer 3. The higher impurity concentration in the anti-inverting region 18 effects this function more successfully.

As has been described, in this embodiment of the present invention, with the anti-inverting region 18 formed along the side walls of the bridge electrodes 8b, the product $R_{on} \times Q_{gd}$ can be retained much smaller, compared with the first embodiment.

(Embodiment 4)

Figure 5:
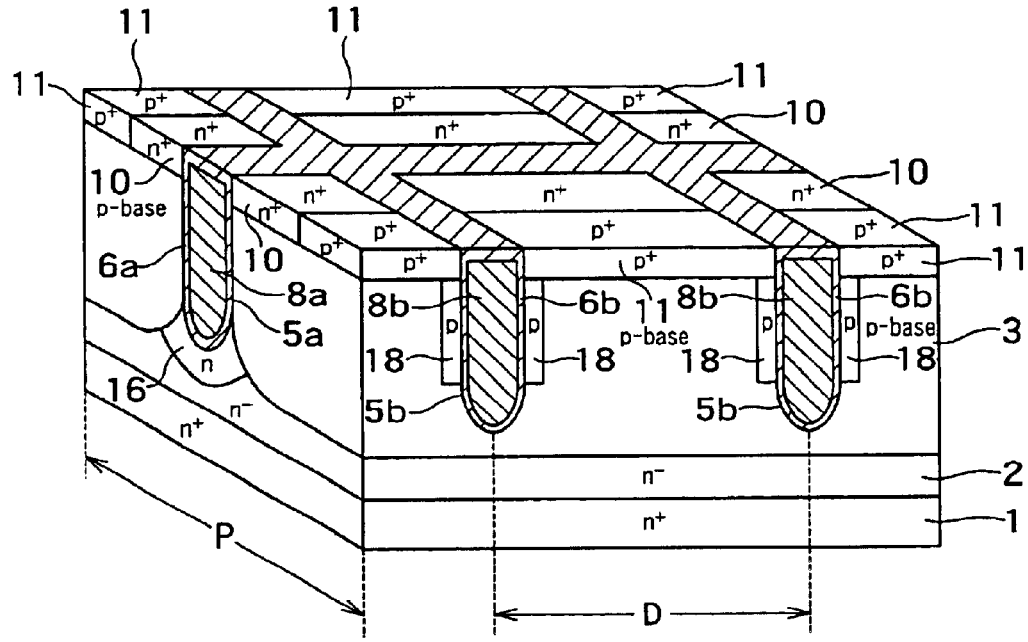
FIG. 5 is a partial cross-sectional perspective view showing a fourth embodiment of the power MOSFET according to the present invention.

FIG. 5 is a partial cross-sectional perspective view showing a fourth embodiment of the power MOSFET according to the present invention. In FIG. 5, like reference numerals denote the similar components to those in the above-mentioned second and third embodiments in FIGS. 3 and 4.

A modified feature of this embodiment is that it is an effective combination of the second embodiment with the third embodiment.

In this embodiment, as shown in FIG. 5, neither of elongated trenches 5a and 5b reaches an upper surface of an n⁻ type epitaxial layer 2. An n type diffusion region 16 is formed around a lower portion of each of the elongated trenches 5a while an anti-inverting region 18 is formed along side walls of the trenches 5b.

Thus, in this embodiment of the present invention, it is increasingly ensured that the gate resistance can be reduced, with $R_{on} \times Q_{gd}$ being retained small.

(Embodiment 5)

Figure 6:
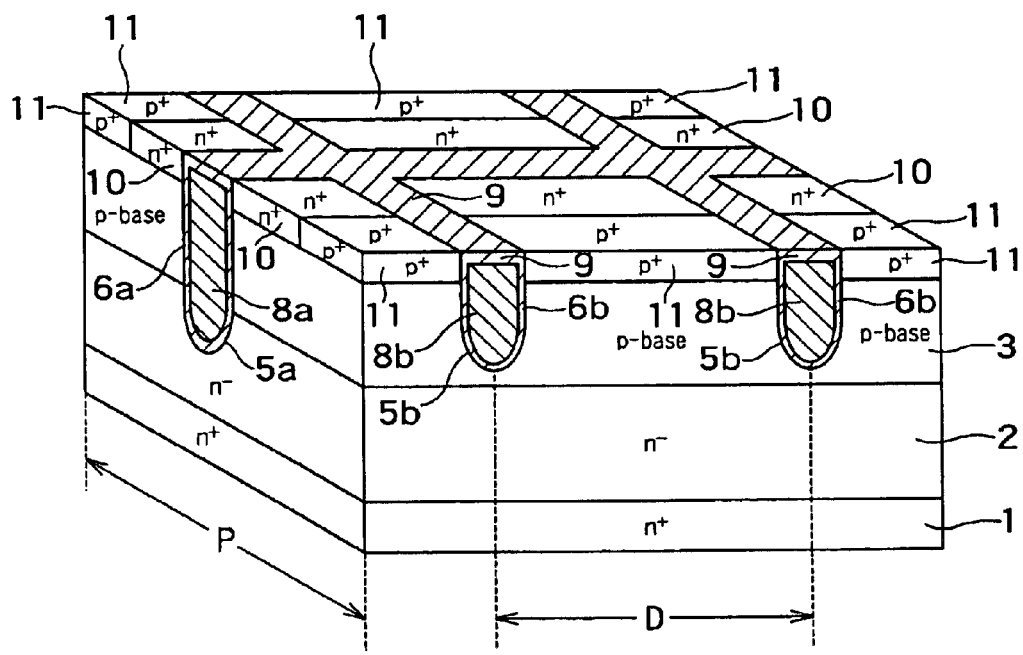
FIG. 6 is a partial cross-sectional perspective view showing a fifth embodiment of the power MOSFET according to the present invention.
Figure 7:
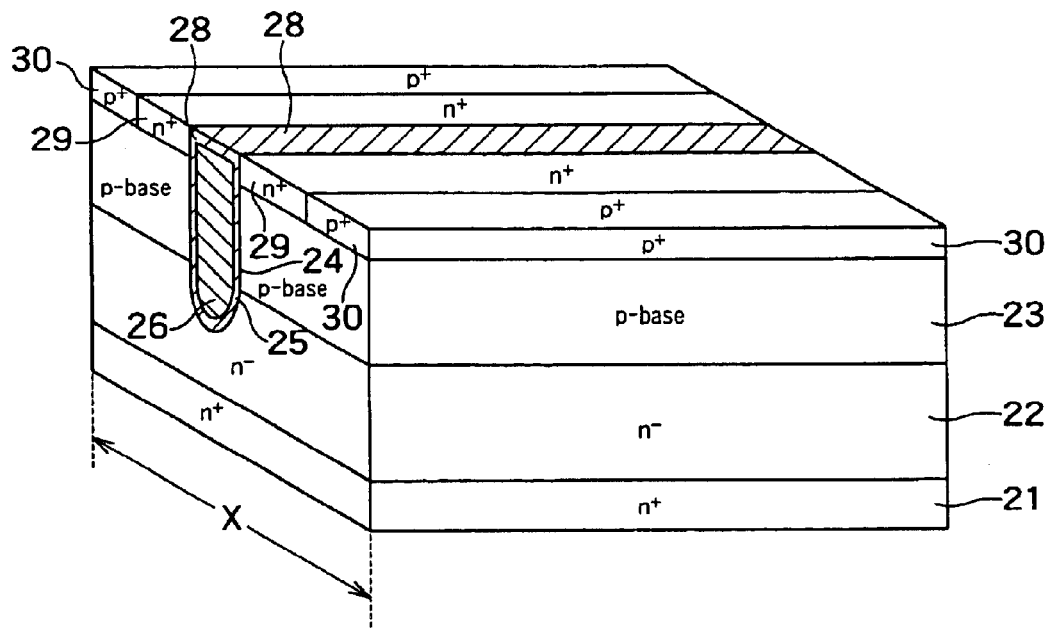
FIG. 7 is a partial cross-sectional perspective view showing a prior art power MOSFET.
Figure 8:
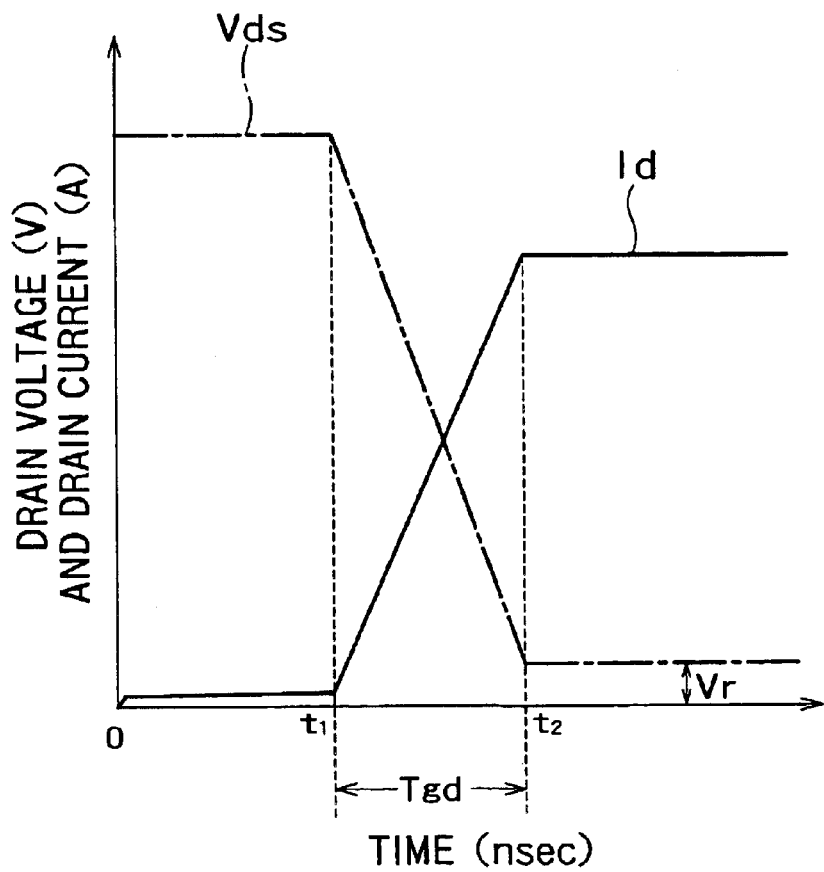

FIG. 6 is a partial cross-sectional perspective view showing a fifth embodiment of the power MOSFET. Like reference numerals denote the similar components to those in the first embodiment in FIG. 1.

A modified feature of this embodiment is that the elongated trenches 5a reach the upper surface of the n⁻ type epitaxial layer 2, but the elongated trenches 5b conducting the trenches 5a to one another do not extend down to the upper surface of the n⁻ type epitaxial layer 2. Thus, the bridge electrodes 8b do not overlap the n⁻ type epitaxial layer, and hence, there is no capacitor developed between the bridge electrodes 8b and the n⁻ epitaxial layer 2. Thus, there is no increase in the gate-drain capacitance ($Q_{gd}$).

Accordingly, in this embodiment of the present invention, the gate resistance can be reduced, with Ron×Qgd being retained small.

In accordance with the present invention, since each of the bridge electrodes connects adjacent ones of the gate electrodes while development of capacitors based on the disposition of the bridge electrodes is avoided as much as possible, accordingly the gate resistance can be reduced, with the product of the ON-resistance and the gate-drain capacitance being retained small. This effects a successful reduction of the switching loss.

What is claimed is:

1. A semiconductor device comprising,
   a first semiconductor layer of a first conductivity type,
   a second semiconductor layer of the first conductivity type formed in an upper surface of the first semiconductor layer, resistance of the second semiconductor layer being higher than that of the first semiconductor layer,
   a base layer of a second conductivity type formed on the second semiconductor layer,
   gate electrodes deposited in a plurality of first trenches, a gate insulation film being disposed between inner walls and the gate electrodes, each of the first trenches having a band-shaped planar pattern and extending from top of the base layer down to the upper surface of the second semiconductor layer,
   bridge electrodes filling a plurality of second trenches and surrounded by an insulation film deposited over walls of the trenches, the second trenches extending from the top of the base layer down to the upper surface of the second semiconductor layer and connecting adjacent ones of the first trenches in communication with one another so that each of the bridge electrodes electrically connects adjacent ones of the gate electrodes,
   an impurity diffused region of the second conductivity type formed in the second semiconductor layer adapted to surround the second trenches existing in the second semiconductor layer,
   a source region of the first conductivity type formed in a surface area of the base layer alongside extensions of the gate electrodes,
   a source electrode formed on the surface of the source region, and
   a drain electrode formed on a back surface of the first semiconductor layer.

2. A semiconductor device according to claim 1, wherein the bridge electrodes are disposed at a predetermined pitch along an extension of the gate electrodes.

3. A semiconductor device according to claim 1, wherein the impurity diffused region of the second conductivity type is formed in the base layer along side walls of the second trenches to reduce carriers induced in the vicinity of the opposite sides of the bridge electrodes upon turning the device on.

4. A semiconductor device according to claim 3, wherein the bridge electrodes are disposed at a predetermined pitch along an extension of the gate electrodes.

5. A semiconductor device comprising, a first semiconductor layer of a first conductivity type, a second semiconductor layer of the first conductivity type formed on an upper surface of the first semiconductor layer, resistance of the second semiconductor layer being higher than that of the first semiconductor layer, a base layer of a second conductivity type formed on the second semiconductor layer, gate electrodes deposited in a plurality of first trenches, a gate insulation film being disposed between inner walls and the gate electrodes, each of the first trenches having a band-shaped planar pattern and extending from top of the base layer down to the upper surface of the second semiconductor layer, bridge electrodes filling a plurality of second trenches and surrounded by an insulation film deposited over walls of the trenches, the second trenches extending from the top of the base layer and being smaller in depth than the base layer, each of the second trenches connecting adjacent ones of the first trenches in communication with one another so that each of the bridge electrodes electrically connects adjacent ones of the gate electrodes, a source region of the first conductivity type formed in a surface area of the base layer alongside extensions of the gate electrodes, a source electrode formed on the source region, an impurity diffused region of the first conductivity type formed around lower portions of the first trenches in the base layer and being contiguous to the second semiconductor layer so as to provide a channel conducting to the source region, and a drain electrode provided on a back surface of the first semiconductor layer.

6. A semiconductor device according to claim 5, wherein the bridge electrodes are disposed at a predetermined pitch along an extension of the gate electrodes.

7. A semiconductor device according to claim 5, further comprising an impurity diffused region of the second conductivity type formed in the base layer along side walls of the second trenches to reduce carriers induced in the vicinity of the opposite sides of the bridge electrodes upon turning the device on.

8. A semiconductor device according to claim 7, wherein the bridge electrodes are disposed at a predetermined pitch along an extension of the gate electrodes.

9. A semiconductor device comprising, a first semiconductor layer of a first conductivity type, a second semiconductor layer of the first conductivity type formed in an upper principal surface of the first semiconductor layer, the second semiconductor layer being higher in resistance than the first semiconductor layer, a base layer of a second conductivity type formed in an upper principal surface of the second semiconductor layer, gate electrodes deposited in a plurality of first trenches, a gate insulation film being disposed between inner walls and the gate electrodes, each of the first trenches having a band-shaped planar pattern and extending from top of the base layer down to the upper surface of the second semiconductor layer, bridge electrodes filling a plurality of second trenches and surrounded by an insulation film deposited over walls of the trenches, the second trenches extending from the top of the base layer and being smaller in depth than the base layer, each of the second trenches connecting adjacent ones of the first trenches in communication with one another so that each of the bridge electrodes electrically connects adjacent ones of the gate electrodes, a source region of the first conductivity type formed on a surface area of the base layer alongside extensions of the gate electrodes, a source electrode formed on the source region, and a drain electrode provided on a back surface of the first semiconductor layer.

10. A semiconductor device according to claim 9, wherein the bridge electrodes are disposed at a predetermined pitch along an extension of the gate electrodes.

* * * * *